United States Patent [19]
Dunnam

[11] Patent Number: 5,214,315
[45] Date of Patent: May 25, 1993

[54] NANOSECOND RF SWITCH DRIVER

[75] Inventor: Curt Dunnam, Trumansburg, N.Y.

[73] Assignee: Cornell Research Foundation, Inc., Ithaca, N.Y.

[21] Appl. No.: 689,535

[22] Filed: Apr. 23, 1991

[51] Int. Cl.⁵ .................. H03K 3/01; H03K 17/687; H03K 17/56; H01P 1/10
[52] U.S. Cl. ..................... 307/270; 307/571; 307/578; 307/246; 307/471; 333/258; 333/262
[58] Field of Search .......... 307/270, 571, 578, 253, 307/254, 471, 246, 262, 264, 268, 584; 328/34, 53; 333/262, 258

[56] References Cited

U.S. PATENT DOCUMENTS

| | | | |
|---|---|---|---|
| 4,486,723 | 12/1984 | Lysobey | 333/17 M |
| 4,616,143 | 10/1986 | Miyamoto | 307/264 |
| 4,843,354 | 6/1989 | Fuller et al. | 333/81 A |
| 4,883,984 | 11/1989 | Kess | 307/256 |
| 4,897,563 | 1/1990 | Bahl | 307/441 |
| 4,906,056 | 3/1990 | Taniguchi | 307/482 |
| 4,916,334 | 4/1990 | Minagawa et al. | 307/296.5 |
| 4,920,284 | 4/1990 | Denda | 307/475 |
| 4,929,853 | 5/1990 | Kim et al. | 307/475 |
| 4,929,855 | 5/1990 | Ezzeddine | 307/571 |
| 4,945,258 | 7/1990 | Picard et al. | 307/264 |
| 4,977,334 | 12/1990 | Handler | 307/264 |
| 5,051,609 | 9/1991 | Smith | 307/270 |

Primary Examiner—William L. Sikes
Assistant Examiner—Trong Quang Phan
Attorney, Agent, or Firm—Jones, Tullar & Cooper

[57] ABSTRACT

An extremely fast high-voltage driver for nanosecond-level switching of gallium arsenide PIN semiconductor devices and other reactive loads utilizes two stages of voltage level translation to permit low voltage TTL logic control signals to control the application of high voltage switching pulses to a load. The circuit utilizes an input stage responsive to TTL level signals to drive a first voltage level translating stage which produces high voltage pulses complementary to the input pulses. The increased voltage pulses are supplied through an intermediate power gain stage to provide amplification of the pulse power level. The amplified pulse is supplied to an output stage for additional level conversion to thereby provide high voltage switching signals to a PIN switch or other reactive load.

13 Claims, 1 Drawing Sheet

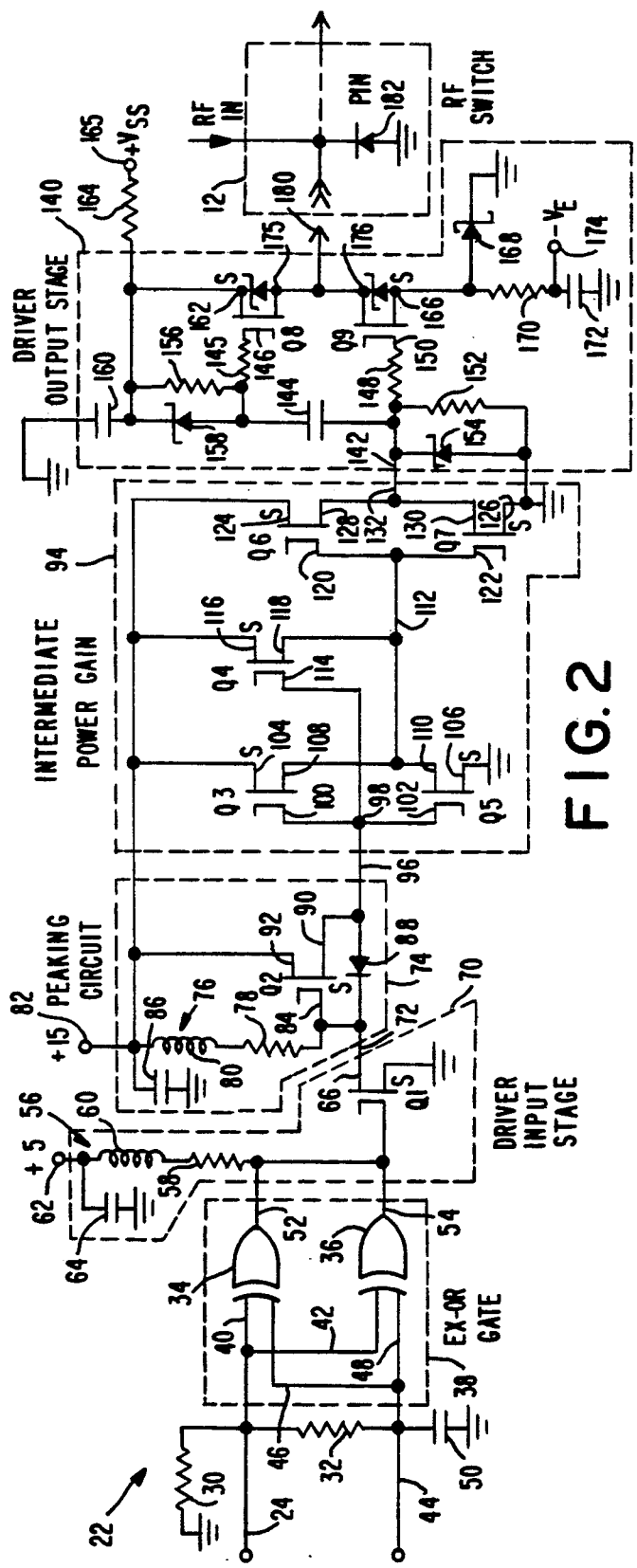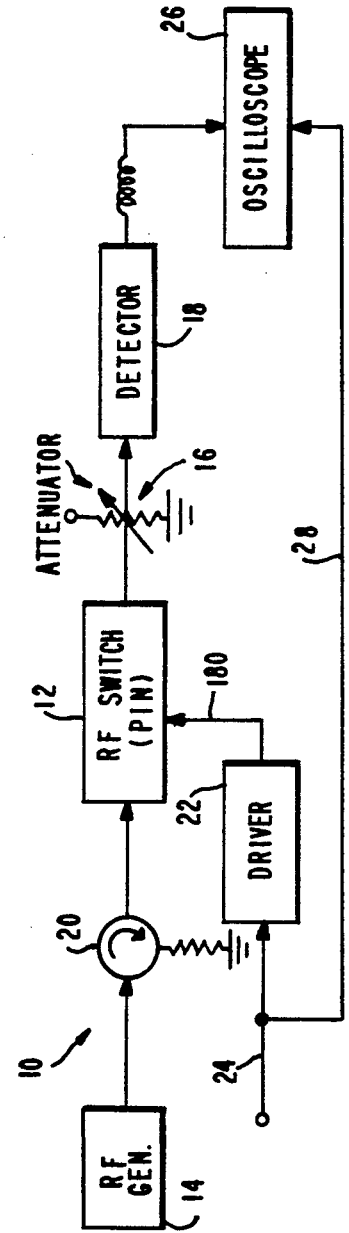
FIG. 2
FIG. 1

NANOSECOND RF SWITCH DRIVER

This invention was made with Government support under Grant No. CHE-8703014 awarded by NSF and under Grant No. R01-GN25862, awarded by NIH. The Government has certain rights in the invention.

BACKGROUND OF THE INVENTION

The present invention relates, in general, to high voltage drivers for switching semiconductor devices and, more particularly, to an extremely high speed driver circuit for nanosecond-level switching of gallium arsenide (GaAs) semiconductor devices such as PIN diodes in microwave switch modules.

Switching circuits for PIN devices are known and are described, for example, in U.S. Pat. No. 4,486,723. This patent shows a cascaded amplifier network responsive to input logic for switching via a reactive impedance to thereby apply either a forward bias current or a relatively high reverse bias voltage to PIN diodes. However, circuits of the type illustrated in the patent provide relatively slow switching, and switching of several orders of magnitude faster than that which is available from circuits of this type is needed for high power, high frequency RF switching for a wide range of applications. In particular, extremely high speed switching is needed in the field of pulsed electron spin resonance (ESR) spectroscopy, as well as in a wide range of research applications, in imaging radar, in ECM/ECCM applications, and the like.

SUMMARY OF THE INVENTION

Briefly, the present invention is directed to a high voltage, high speed driver circuit for providing rapid switching voltages to RF switch assemblies and more particularly for semiconductor switches such as gallium arsenide PIN-junction devices. The driver provides an output in the range of 100 to 500 volts and is capable of transferring a sufficient charge to switch an array of PIN-junction devices in an interval of several nanoseconds.

In the presently-preferred form of the invention, an input switching signal for the driver circuit is supplied by way of an exclusive OR (EX-OR) gate to a driver input stage, the EX-OR gate providing the correct impedance and bias for the input stage to allow the system to accept either positive-going or negative-ongoing input signals. The driver input stage is followed by a peaking circuit which causes the input stage to switch rapidly in response to the input signal, thereby providing a squared driving pulse for triggering the following power amplifier stages. The peaking circuit also serves as a first voltage level translation stage, converting the input pulse, which is at conventional TTL level, to a higher voltage CMOS device level of 15 volts. The increased voltage level output pulse from the peaking circuit is fed to the input of cascaded intermediate power gain stages, the output of which is provided by a matched pair of semiconductor devices which provide the symmetric current capacity required for the final output stage of the device. The final output stage includes a wide band resistor-capacitor network which is capable of switching at speeds approaching one nanosecond, and which responds to signals from the intermediate stage to supply level-translated pulses to a pair of output power drivers. These drivers are connected to a high voltage source to provide a second voltage level conversion at their outputs in a way which does not significantly contribute to switching time. The power drivers are switched on and off under the control of a passive wide band switching network to produce high voltage switching pulses which are supplied to the RF switch which is to be controlled by the present circuit. The wide band network for the final output stage drivers is capable of switching at speeds approaching one nanosecond, with its transition time being limited only by parasitic inductances attributable to its physical layout and device packaging. A pair of zener diodes in this network provides transient protection to prevent excess current conduction in the final output stage when the high voltage power supply is switched on.

The PIN diodes which form the RF switch driven by the circuit of the present invention essentially provide a capacitive load to the drive circuit. Because of the reactive nature of this load it is preferred to locate the circuit board which carries the driver of the present invention directly on the RF switch block to minimize the disruptive effects of drive line inductance.

In operation, pulses are supplied through the input buffer circuit which includes the EX-OR gate to activate the driver input stage to switch it from its normal off condition to an on condition. This produces an inverted intermediate-voltage pulse at the output of the driver input stage which is then supplied through a peaking circuit to the intermediate power gain stage which provides intermediate amplification of the pulse power level. The output of this intermediate amplification stage is connected to a high voltage driver output stage which is, in turn, connected to the RF switch which is to be controlled by the driver. The final stage includes circuitry for turning the output transistors on and off at very high rates to provide high peak switching currents to the RF switch PIN diodes. The co-located driver circuit of the present invention provides the high voltage switching pulses that are needed for nanosecond gallium arsenide PIN diode switching with a minimization of undesirable transmission line effects.

BRIEF DESCRIPTION OF THE DRAWINGS

The foregoing, and additional objects, features and advantages of the present invention will become apparent to those of skill in the art from a consideration of the following description of a preferred embodiment thereof, taken in conjunction with the accompanying drawings, in which:

FIG. 1 is a diagrammatic illustration of a test circuit for the driver of the present invention; and FIG. 2 is a schematic diagram of a preferred form of the high speed RF switch driver of the present invention.

DESCRIPTION OF PREFERRED EMBODIMENT

Turning now to a more detailed description of the present invention, there is illustrated in FIG. 1 a test circuit 10 for the high speed driver circuit of the present invention. The circuit includes an RF switch 12 which may incorporate, for example, three PIN diodes connected between a source of RF energy such as the RF generator 14 and a load device typified by attenuator 16 and detector 18. If desired, the RF energy from generator 14 is supplied to switch 12 by way of a four-port circulator 20. The RF switch is turned on and off by means of the driver 22 of the present invention which, in turn, is controlled by an input pulse supplied by way of input line 24. The input pulse activates driver 22 which, in turn, provides a high voltage, high speed switching signal to cause the RF switch 12 to pass or to reflect the RF signals from generator 14. Signals passed by switch 12 are supplied through attenuator 16 to a detector 18 for display on an oscilloscope 26 connected to the output of detector 18. The input pulse on line 24 is also supplied by way of line 28 to the oscilloscope for display synchronization.

The RF switch 12 may be a Varian WR-90 style X-band microwave switch which incorporates three gallium arsenide PIN diodes which reflect or pass microwave energy, depending on the diode bias condition. The switch provides a necessary transformation from a waveguide $TE_{1,0}$ mode to the approximately 50 ohm characteristic impedance of the coaxial diode cavities. Because of the reactive nature of the diode load, the driver circuit 22 is preferably mounted on the switch to minimize the highly disruptive effects of drive line inductance.

Quiescent condition: input level @ 24 equals mode select level @ 44, for which case output device $Q_9$ conducting, $Q_8$ off and PIN's forward biased (RF switch reflective). Referring now to FIG. 2, when the circuit 22 is in the quiescent condition, with no input pulse on line 24, the output of circuit 22 forward biases the PIN switch 12, so that the switch is reflective. A system timing input pulse is applied to line 24 to detemine whether the RF switch is to be in its reflective or transmissive mode. The input pulse is a transistor-transistor logic (TTL) input, and may be either positive or negative with respect to a polarity-selecting input (to be described). Line 24 is terminated in a standard coaxial line immpedance of 50 ohms by resistors 30 and 32 connected as a voltage divider across line 24. This voltage divider also provides the proper input bias for a pair of TTL buffers 34 and 36 parallel-connected as an EX-OR gate 38 to the input line 24 at the junction of the resistors 30 and 32. Thus, the input line 24 is connected by way of line 40 to one input of buffer 34 and by way of line 42 to a corresponding input of buffer 36.

A fixed TTL voltage level is connected as a polarity-selecting input to a second input line 44 and to the EX-OR gate 38, line 44 being connected by way of line 46 to a second input of buffer 34 and by way of line 48 to a second input of buffer 36. The voltage level applied to line 44 provides a polarity selection for the EX-OR gate 38 to permit selection of the logic polarity with respect to the remainder of the driver circuit 22 and the RF switch 12, the input voltage on line 44 thus biasing the input OR gate 38 for either inverting or non-inverting operation. A capacitor 50 is connected between resistor 32 and ground, with the junction of the resistor and capacitor being connected to line 44. The capacitor insures an AC ground reference across the resistor 32. The circuit 22 is in the quiescent condition when the input level on line 24 is equal to the input level on line 44.

The outputs 52 and 54 of buffers 34 and 36, respectively, are connected to a pull-up network 56 which includes a series RL network consisting of resistor 58 and inductor 60 connected in series between the output of EX-OR gate 38 and a TTL voltage source 62. The junction between the voltage source 62 and the inductor 60 is connected through a bypass capacitor 64 to ground. The parallel outputs 52 and 54 from the buffers 34 and 36 are capable of switching a 50 pF load capacitance in approximately 2.5 nanoseconds with the assistance of the pull-up network 56.

The outputs 52 and 54 from the exclusive OR gate 38 are also connected in parallel to the gate of a low-threshold N-channel power MOSFET device Q1 which is normally biased to an off, or nonconducting, condition, with its source being connected to ground. A pulse from the parallel buffer outputs will switch Q1 to its conducting condition to produce a complementary output pulse on the drain terminal 66 of Q1. The pull-up network 56 and the transistor Q1 cooperate to form a driver input stage 70 for the driver circuit 22, the pull-up network 56 providing an input pulse to Q1 that has a rapid rise time at its leading edge as well as a rapid fall time at the trailing edge of the trigger pulse.

The output from the input driver stage 70 is connected by way of line 72 to a peaking circuit 74 which includes a second pull-up network 76 and a second transistor Q2 connected in parallel, the peaking circuit being connected to the input line 72. The pull-up network 76 includes a series RL network including resistor 78 and inductor 80 connected in series with a CMOS-level voltage source at terminal 82, which voltage is at a higher level than that supplied to the terminal 62, thereby resulting in a CMOS level voltage being applied to the input gate 84 of transistor Q2. A bypass capacitor 86 is connected between terminal 82 and ground. The values of the pull-up RL network 76 are optimized for minimum rise and fall times for the input pulse received from stage 70, which pulse is supplied to the complex impedance presented by the gate 84 of transistor Q2 and a parallel diode 88 connected between gate 84 and the source 90 of transistor Q2. The drain 92 for transistor Q2 is connected through capacitor 86 to ground. Q2 is a low threshold N-channel device connected as a source-follower, and is active as a high current pull-up on the trailing edge of the trigger pulse supplied from driver 70. The diode 88 is a two nanosecond silicon switching type, to provide fast pull down for the gates of the following stage to be described.

The peaking circuit 74 thus responds to the beginning of Q1's conduction by aiding in switching Q1 rapidly on. This rapid voltage decrease drives the following intermediate power gain stage, generally indicated at 94 through the switching diode, 88. When Q1 is turned off at the end of the input pulse from EX-OR gate 38, there is a substantial initial charge current through the pull up network 76 to compensate for the capacitive load represented by the parallel connection of the gate of Q2 and the diode 88 to thereby provide rapid switching of Q2 on, and to produce a sharp positive-going trailing edge for the output pulse on line 96.

Source 90 is connected by way of line 96 to the input 98 of intermediate power gain network 94. The input 98 is connected to complementary-connected transistors Q3, Q4 and Q5, and the outputs of these transistors are connected to complementary-connected transistors Q6 and Q7 to provide intermediate amplification of the pulse power level prior to conversion to the still higher voltage level of the output stage to be described.

Input line 98 is connected in parallel to the gates 100 and 102 of transistors Q3 and Q5, respectively, with the source 104 of transistor Q3 being connected through capacitor 86 to ground and the source 106 of transistor Q5 being connected directly to ground. The drains 108 and 110 of Q3 and Q5 are connected in parallel to line 112 which is connected to the parallel gates of transistors Q6 and Q7. Transistor Q4 is connected in parallel to Q3, to compensate for the higher drain source resistance of the P-channel power MOSFETS used in this device.

Thus, input 98 is connected to the gate 114 of Q4, in parallel with the gates of Q3 and Q5, its source 116 of Q4 is connected in parallel with the source 104 of Q3 through capacitor 86 to ground, and drain 118 of Q4 is connected to line 112 in parallel with the drains 108 and 110 of Q3 and Q5.

The pulse on line 112 is connected in parallel to the gates 120 and 122, respectively, of transistors Q6 and Q7, with the source 124 of transistor Q6 being connected through capacitor 86 to ground and the source 126 of transistor Q7 being connected to ground. The drains 128 and 130 of transistors Q6 and Q7, respectively, are connected in parallel to the output line 132 of the intermediate power gain stage 94.

The intermediate stage output voltage on line 132 is applied to a driver output stage 140 by way of an input line 142 and an isolating capacitor 144, through resistor 145 to the gate 146 of a power transistor Q8. The voltage on line 142 is also supplied by way of a series resistor 148 to the gate 150 of a second power transistor Q9. A resistor 152 and a parallel Zener diode 154 are connected between line 142 and ground while a resistor 156 and a parallel Zener diode 158 are connected to the gate resistor 145 and through a capacitor 160 to ground. The Q8 source 162 is connected through capacitor 160 to ground and is also connected through resistor 164 to a source of high voltage $V_{SS}$ at terminal 165. The source 166 of transistor Q9 is connected through a Schottky diode 168 to ground, and through a resistor 170 and a capacitor 172 also to ground, with the junction between elements 170 and 172 being connected to a negative bias voltage $-V_E$ at terminal 174. The drains 175 and 176 of transistors Q8 and Q9, respectively, are connected to a driver output line 180 leading from the power stage 140. The output line 180 is connectable to the RF switch 12 to control the conductivity of one or more PIN diodes such as the diode illustrated at 182. Transistors Q8 and Q9 are controlled-avalanche devices.

As indicated above, when circuit 24 is quiescent, as when the input level on line 24 equals the level on the mode select input line 44, the output device Q9 is conducting and Q8 is off, to forward bias PIN diode 182. When an output pulse is supplied to the input of EX-OR gate 38, the transistor Q1 is switched on to produce an input pulse at the peaking circuit 74. When this occurs, diode 88 conducts to provide an input to the succeeding intermediate power gain stage 94. Stage 94 utilizes transistors Q3, Q4 and Q5 to provide a corresponding pulse to the input of transistors Q6 and Q7, with transistor Q4 being connected in parallel with Q3. The paralleling of two P-channel transistors Q3 and Q4 is used to compensate for the drain-source resistances of the P-channel device Q3 with respect to the N-channel device Q5. The transistors Q6 and Q7 are a matched pair of driven devices, having the same drain-source resistance when turned on, and thus provide the symmetric current capacity that is required by the gates of transistors Q8 and Q9, which form the load for the power gain stage 94.

Capacitor 144 is the driver output stage coupling capacitor which provides a charging path from source $V_{SS}$ through resistors 164, 156, the capacitor 144 and resistor 152 to ground. At start up, when the capacitor is charging, the charging current provides bias voltages across both resistors 156 and 152 which may bias both transistors Q8 and Q9 to their on conditions. If both transistors are conductive, excess current is shunted to ground from the source $V_{SS}$ through Q8 and Q9 and through either resistor 170 or diode 168, depending upon the rate of change of the voltage applied to the circuit. Diode 168 is a Schottky diode and conducts only if the voltage at node 166 of transistor Q9 exceeds a specified value. This shunt current path through Q8 and Q9 around capacitor 144 may remain conducting until that capacitor is charged. When the voltage across capacitor 144 reaches approximately $V_{SS}$, the required high voltage potential, charging ceases.

During the quiescent state of the driver network following start-up; that is, between input pulses to gate 38, transistor Q6 is held on while Q7 is off to provide a 15 volt bias voltage from terminal 82 on the output line 132. This output line is DC coupled to the high-voltage N-channel transistor Q9 so that the positive 15 volt bias is supplied to the gate terminal 150 of Q9, holding it in its "on" state. When Q9 is on, a current flows through the RF switch PIN array, when the driver circuit 22 is connected to the switch 12, through output line 180 of the driver, through transistor Q9 and through resistor 170 to the negative reference voltage $-V_E$ at terminal 174. Diode 168 is reverse biased, and remains off. This current flow is determined by the forward voltage drop of the PIN diodes and by the value of resistor 170, since that resistance is large with respect to the drain-source resistance of Q9 when that transistor is on, and forward biases diode 182 so that the PIN switch is on, and RF energy does not pass through it. Under this quiescent condition, transistor Q8, which is a P-channel complement to Q9, remains biased to its off condition by resistor 156.

When it is desired to reverse bias the PIN switch 12 to switch it to its off condition, an input pulse is supplied to the driver 22 by way of line 24. This produces an input pulse at Q1 which switches Q1 from its off condition to its on condition, producing a negative-going pulse at the gate of Q2 to turn that transistor off and diode 88 on. The pull-up networks and the peaking circuitry for Q1 and Q2 cause the pulse to have fast rise and fall times, as described above. The squared pulse is applied by way of line 96 to the power gain circuit 94 to switch transistor Q6 off and to switch Q7 on. This produces a 15 volt negative-going pulse on line 142, the leading edge of which is coupled through capacitor 144 to the gate of Q8 to turn Q8 fully on. At the same time, the leading edge of the pulse switches Q9 off because the negative voltage $V_E$ does not exceed the gate turn-on threshold with zero bias voltage applied to gate 150 of Q9. Rapid input switching of Q8 and Q9 provides an extremely fast output voltage transition on output line 180 from the negative forward voltage drop across the PIN diodes $(-V_{PIN})$ to the high voltage level which has been stored across capacitor 160 by the voltage source $V_{SS}$. The capacitance of capacitor 160 is large enough to insure that it has sufficient charge to provide the current flow to the PIN devices required to produce the desired switching action with negligible voltage drop across the capacitor.

When the output stage 140 receives an "on" pulse on line 142, the charge on the gate 146 of transistor Q8 is rapidly augmented through capacitor 144 and now-conductive transistor Q7. Transistor Q9 is switched off during the time that Q8 is conductive so that the voltage $V_{SS}$ is applied to the PIN diodes 182 to reverse bias these diodes and to switch them to a nonconductive condition so that RF energy can flow through the switch block 12. When forward biased, the PIN diodes are conductive and act as low-value resistors, although they have a capacitive component. However, during the on pulse, when the diodes are reverse biased, switch 12 acts as a capacitor and thus is a reactive load for the driver circuit.

Because the PIN device is a reactive load, its switching time between on and off conditions is inversely proportional to the current that flows through the device. To enhance switching speed at the leading edge of the pulse, the MOSFET driver presents a low-impedance high voltage source to the PIN array, causing charge carriers to be forcibly swept from the PIN I-region. This action results in a 4 to 8 nanosecond diode turn-off transition time, which is significantly faster than the diode intrinsic time constant of 20 to 40 nanoseconds.

A reverse bias of about 180 volts provides the required switching operation for the RF switch block 12. At this bias level, such devices can safely accommodate up to 2KW power, the limit being determined by the peak voltage across the PIN devices plus the peak RF potential supplied to the switch. Reverse voltage across the PIN diode array during the on condition of the RF switch 12 must be sufficient to prevent the RF voltage from applying a forward bias to the device and thus turning it on.

At the trailing edge of the input pulse on line 24, transistor Q1 returns to its off condition, causing Q2 to supply charging current to gate electrodes 100 and 102 of Q3 and Q5. As noted above, the peaking circuit 74 insures a fast fall time for the pulse. This positive-going trailing edge is supplied by the intermediate power gain circuit 94 to switch Q7 off and Q6 on, thereby causing Q8 to switch off and Q9 to switch on, rapidly restoring a forward bias condition across the PIN diode array. Schottky diode 168 clamps the source terminal 166 of Q9 at approximately ground voltage level, insuring a peak PIN diode turn on injection current several orders of magnitude above the quiescent PIN array current.

Transistors Q8 and Q9 are avalanche-rated devices for protection from transient voltages which can occur during high voltage switch-on or ouptut fault conditions. Zener diodes 154 and 158 also provide a quick discharge path for capacitor 144 through resistor 164 if the high voltage level $V_{SS}$ decreases rapidly, as when the device is shut down.

Control of the charging of coupling capacitor 144 is essential to avoid an overstress condition at transistors Q8 and Q9 when the device is first turned on and the high voltage $V_{SS}$ is applied to the output stage. Therefore, as explained above, during the power-up transient, both the output devices Q8 and Q9 conduct at a level which is determined by the transfer characteristics of the transistors and the value of the series resistor 164. A resulting constant gate bias voltage appears across each of the gate resistors 156 and 152 and results in a predictable, constant charging current into capacitor C144. A specific charging rate may be fixed by selecting appropriate values for these gate resistors. To insure negligible drop during the pulse "on" interval, this time constant must be at least two orders of magnitude greater than the width of the longest anticipated "on" pulse. The value of capacitor 144 is, in turn, determined by selecting a value which satisfies the time constant criterion, given the above values for resistors 156 and 152.

Capacitors 64, 86 and 172 provide local bypassing for the various supply voltage sources at terminals 62, 82 and 174, respectively.

In a test of the circuit described above in FIG. 2, wherein an RF signal of 1.25 KW incident power at 9.2 GHZ was controlled by an RF switch 12 utilizing PIN diodes, the driver of the present invention provided the following characteristics:

| | |
|---|---|
| RF RISETIME: | 8.0 ns (10–90%) |
| | 10.0 ns (to −0.22 dBs) |
| RF FALLTIME: | 4.0 ns (90–10%) |
| | 5.0 ns (to ≦ −35 dBs) |
| DELAY (input high to RF): | 54 ns (50–50%) |
| HOLD (input low to RF): | 68 ns (50–50%) |
| MINIMUM RF PULSE WIDTH: | 20 ns (FWHM) |
| RF SWITCH INSERTION LOSS: | −0.62 dBr |

Where dBs=0 at minimum PIN attenuation (excluding switch assembly insertion loss), and dBr=0 for an equivalent section of WR90 waveguide.

Although the present invention has been described in terms of a preferred embodiment, it will be understood that numerous variations and modifications may be made without departing from the true spirit and scope thereof. Thus, for example, although the driver circuit is illustrated as controlling a capacitive PIN device, it is more generally useful for driving reactive loads of various kinds. Furthermore, although its specific application has been to provide controlled RF signals for electron spin resonance devices, numerous other applications will be apparent to those of skill in the art. Thus, the scope of the present invention is limited only by the following claims.

What is claimed is:

1. A high speed drive circuit for switching reactive loads, comprising:

input buffer means for receiving an input pulse, said buffer means including an exclusive OR gate;

an input stage connected to an output of said input buffer means for producing, in response to said input pulse, a first stage pulse output at a first voltage level;

a peaking circuit responsive to said first stage pulse output to produce a corresponding second stage pulse output, said peaking circuit including means providing fast rise and fall times for said first stage pulse output; and means responsive to said second stage pulse output to selectively produce on an output line, a corresponding switching pulse at a second voltage level higher than said first voltage level and having a rise time and a fall time of less than about 10 ns.

2. A high speed drive circuit for switching reactive loads, comprising:

an input stage responsive to an input pulse to produce a corresponding first stage pulse output at a first voltage level;

a peaking circuit responsive to said first stage pulse output to produce a corresponding second stage pulse output, said peaking circuit including:

a) pull-up circuit means for providing minimum rise and fall times for said first stage pulse output; and, b) means responsive to leading and trailing edges of said first stage pulse output for producing said second stage pulse output, said means comprising a transistor means connected to a switching diode, the leading edge of said first stage pulse output switching said transistor off and said diode on, and the trailing edge of said first stage pulse output switching said transistor on and said diode off to produce said second stage pulse output, whereby sharp leading and trailing edges for said second stage pulse output are provided; and, means responsive to said second stage pulse output to selectively produce on an output line a corresponding switching pulse at a second voltage level higher than said first voltage level and having a rise time and a fall time of less than about 10 ns.

3. The high speed drive circuit of claim 2, wherein said input stage includes a pull-up network for said input pulse for rapidly switching said input stage to a conductive state.

4. The drive circuit of claim 2, further including input buffer means for receiving said input pulse, said buffer means including an exclusive OR gate.

5. A high speed drive circuit for switching reactive loads, comprising:

an input stage responsive to an input pulse to produce a corresponding first stage pulse output at a first voltage level;

means responsive to said first stage pulse output to produce a power driver pulse having a leading edge and a trailing edge; and, a driver stage having an input line and an output line and including a first, normally nonconductive controllable semiconductor device and a second, normally conductive controllable semiconductor device connected to said output line, and means connected to said input line and responsive to said power driver pulse to selectively produce on said output line, a corresponding switching pulse at a second voltage level higher than said first voltage level and having a rise time and a fall time of less than about 10 ns;

said means responsive to said power driver pulse including a coupling capacitor connected between said input line and a source of voltage, said capacitor being also connected to said first semiconductor device, said input line being further connected to said second semiconductor device;

whereby said leading edge of said power driver pulse drives said second semiconductor device nonconductive and said first semiconductor device conductive, and whereby the trailing edge of said power driver pulse drives said first semiconductor device nonconductive and said second semiconductor device conductive to produce said switching pulse.

6. The drive circuit of claim 5, wherein said input stage includes a pull-up network for said input pulse for rapidly switching said input stage to a conductive state.

7. The drive circuit of claim 5, further including input buffer means for receiving said input pulse, said buffer means including an exclusive OR gate.

8. The drive circuit of claim 5, further including bias voltage means connected through said second semiconductor device to said output line when said second semiconductor device is conductive for providing a quiescent bias voltage on said output line.

9. The drive circuit of claim 8, further including means connecting said source of voltage through said first semiconductor device to said output line when said first semiconductor device is conductive, whereby said switching pulse is at the voltage level of said source of voltage.

10. The drive circuit of claim 5, further including RF switching means connected to said output line and responsive to said switching pulse.

11. The drive circuit of claim 5, further including clamping diode means connected between said second semiconductor device and a ground reference point to clamp said second semiconductor device to ground.

12. The drive circuit of claim 5, further including means controlling the charge on said coupling capacitor during a start up of said drive circuit.

13. The drive circuit of claim 12, wherein said controlling means includes first resistor means connected between said coupling capacitor and said source of voltage.

* * * * *